(12) United States Patent
Wang et al.

(10) Patent No.: US 11,830,809 B2
(45) Date of Patent: Nov. 28, 2023

(54) MAGNETIC STRUCTURES IN INTEGRATED CIRCUIT PACKAGE SUPPORTS

(71) Applicant: Intel Corporation, Santa Clara, CA (US)

(72) Inventors: Ying Wang, Chandler, AZ (US); Yikang Deng, Chandler, AZ (US); Junnan Zhao, Gilbert, AZ (US); Andrew James Brown, Phoenix, AZ (US); Cheng Xu, Chandler, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 16/829,336

(22) Filed: Mar. 25, 2020

(65) Prior Publication Data

US 2021/0305154 A1 Sep. 30, 2021

(51) Int. Cl.
| | |
|---|---|
| *H01L 23/522* | (2006.01) |
| *H01L 23/528* | (2006.01) |
| *H01L 23/532* | (2006.01) |
| *H01L 49/02* | (2006.01) |

(52) U.S. Cl.
CPC ...... *H01L 23/5227* (2013.01); *H01L 23/5226* (2013.01); *H01L 23/5283* (2013.01); *H01L 23/53209* (2013.01); *H01L 23/53228* (2013.01); *H01L 28/10* (2013.01)

(58) Field of Classification Search
CPC ............. H01L 23/5227; H01L 23/5226; H01L 23/5283; H01L 23/53209; H01L 23/53228; H01L 28/10
See application file for complete search history.

(56) References Cited

U.S. PATENT DOCUMENTS

| | | | |
|---|---|---|---|
| 2005/0030821 A1* | 2/2005 | Tai | G11C 11/16 365/232 |
| 2019/0221345 A1* | 7/2019 | Vadlamani | C22C 45/04 |
| 2020/0066634 A1* | 2/2020 | Do | H01L 23/49822 |

* cited by examiner

*Primary Examiner* — Peniel M Gumedzoe
(74) *Attorney, Agent, or Firm* — Akona IP

(57) ABSTRACT

Disclosed herein are magnetic structures in integrated circuit (IC) package supports, as well as related methods and devices. For example, in some embodiments, an IC package support may include a conductive line, a magnetic structure around the conductive line, and material stubs at side faces of the magnetic structure.

19 Claims, 9 Drawing Sheets

MAGNETIC STRUCTURES IN INTEGRATED CIRCUIT PACKAGE SUPPORTS

BACKGROUND

The performance of some integrated circuit (IC) elements, such as inductors, may be enhanced by the use of magnetic materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
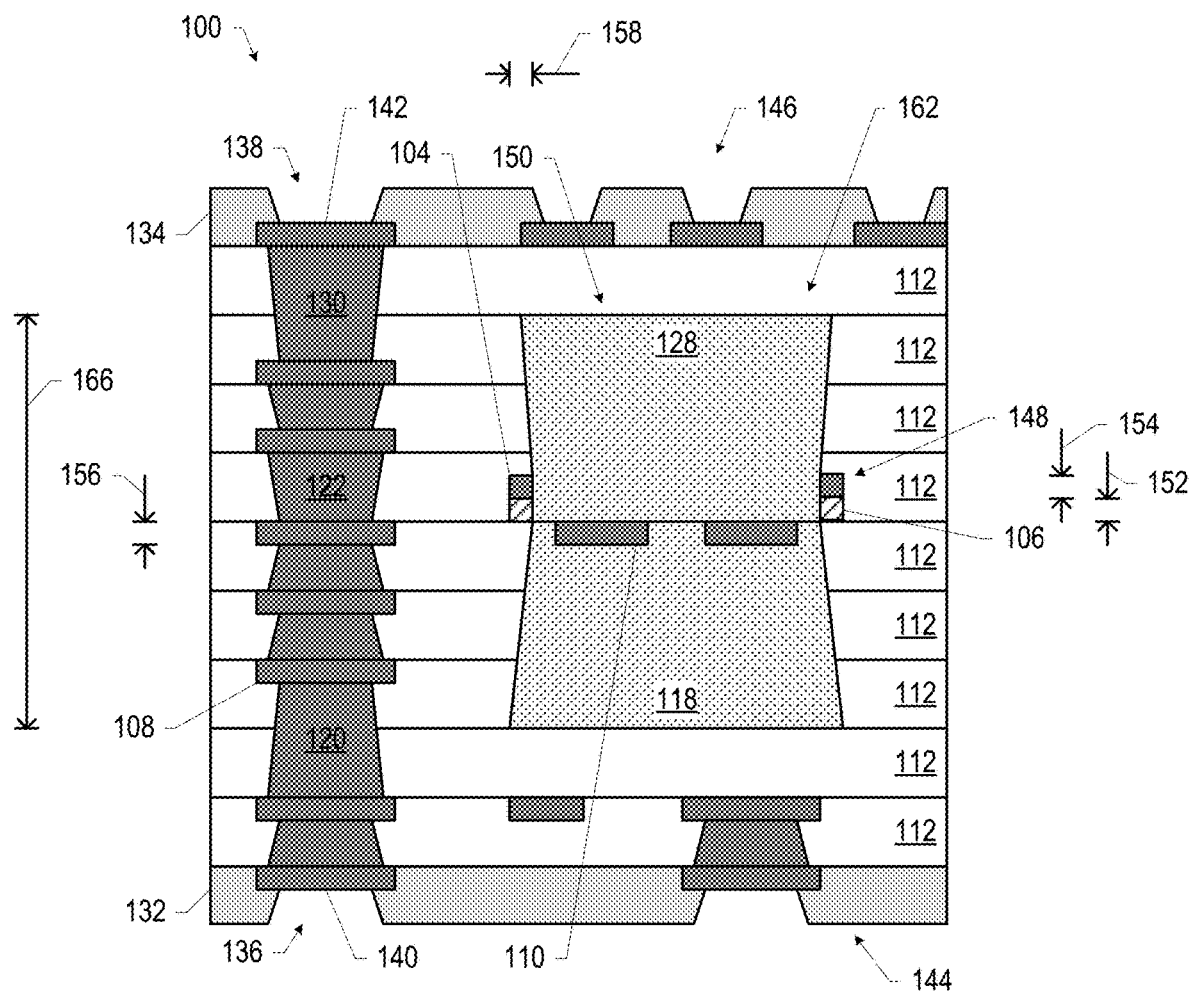
FIG. 1 is a side, cross-sectional view of an example integrated circuit (IC) package support including a magnetic structure, in accordance with various embodiments.

Disclosed herein are magnetic structures in integrated circuit (IC) package supports, as well as related methods and devices. For example, in some embodiments, an IC package support (e.g., a package substrate or an interposer) may include a conductive line, a magnetic structure around the conductive line, and material stubs at side faces of the magnetic structure.

Magnetic structures may improve the electrical performance of some IC assemblies. For example, using inductors enhanced with magnetic structures (e.g., magnetic-material-enhanced inductors) in a package substrate or other IC package support may improve power delivery performance. However, conventional techniques for forming such magnetic structures (e.g., conventional paste printing) may have inadequate dimension control (e.g., in both lateral dimensions and thickness) for desired applications. Designers relying on such techniques must include a large keep-out zone around such structures to mitigate the risk of bridging, increasing the footprint of the structure in both the x-/y- and z-directions. Planarization may be performed to control the thickness of a magnetic structure, but such processes are expensive and not conventionally compatible with high volume manufacturing (HVM). Further, the achievable minimum thickness of conventional magnetic structures may be so high as to necessitate the use of high aspect ratio vias on the same layer. Such vias may be difficult to fabricate (e.g., due to limitations of laser drilling, via cleaning, and metal filling), and may present reliability issues (e.g., due to the increased crack risk arising from vias with small bottom diameters).

Various ones of the embodiments disclosed herein may provide process flows and structures that may address one or more of the issues highlighted above, and may be compatible with HVM processes. The IC package supports disclosed herein may be particularly valuable for ultra mobile computing devices, such as laptops and tablets with very thin form factors. The manufacturing techniques disclosed herein may enable the use of inductors enhanced by magnetic material anywhere in an IC package support, instead of limited to a face of an IC package support as required by some previous approaches. Further, the manufacturing techniques disclosed herein may avoid exposing magnetic materials to damaging desmear, plating, and/or etch chemistries, and thus may achieve higher quality magnetic structures than previously achievable. The IC package supports 100 disclosed herein may include magnetic structures having any desired thicknesses or thickness asymmetry relative to the embedded inductor trace, allowing for improved performance.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 2" may be used to refer to the collection of drawings of FIGS. 2A-2O.

FIG. 1 illustrates an IC package support 100 (e.g., a package substrate or an interposer) having a magnetic structure 150 therein. The IC package support 100 may have a first face 146 at which conductive contacts 142 are exposed through openings 138 in a solder resist 134, and an opposing second face 144 at which conductive contacts 140 are exposed through openings 136 in a solder resist 132. In some embodiments, the conductive contacts 142 may be suitable for first-level interconnects (FLI, such as solder bumps) and the conductive contacts 140 may be suitable for second-level interconnects (SLI, such as solder balls), or vice versa. For example, FLI (not shown) may electrically couple the IC package support 100 to one or more dies, other active or passive devices, or an interposer. SLI (not shown) may couple the IC package support 100 to a circuit board (e.g., a motherboard), an interposer, or a package substrate. As shown, the IC package support 100 may be a "coreless" support. In some embodiments, the conductive contacts 142 and/or the conductive contacts 140 may have a nickel-palladium-gold surface finish; such embodiments may be advantageous relative to embodiments in which the conductive contacts 142/140 have an organic solderability preservative (OSP) finish, as contacts with nickel-palladium-gold surface finishes may be electrically tested while still protecting the contacts from oxidation (while OSP-finished contacts require a clean before testing).

A number of dielectric layers 112 may be arrayed between the first face 146 and the second face 144. The dielectric layers 112 may include any suitable dielectric materials. For example, a dielectric layer 112 may be a buildup film (e.g., an organic, polymer-based dielectric film), or a glass cloth impregnated with a dielectric material (a "prepreg" material). One or more interconnect structures 108 may be embedded in the dielectric layers 112, including conductive lines and vias, as shown. The interconnect structures 108 may provide electrical pathways between conductive contacts 142, between conductive contacts 140, between conductive contacts 140 and 142, and/or between conductive contacts 140/142 and elements within the IC package support 100.

One particular element within the IC package support 100 to which interconnect structures 108 may be coupled is an inductor 162. The inductor 162 may include one or more conductive lines 110 surrounded by a magnetic structure 150; the conductive line(s) 110 may serve as the inductor trace. The magnetic structure 150 may include a first portion 118 and a second portion 128. The first portion 118 may surround bottom and side faces of the conductive line 110, as shown, while the second portion 128 may be at a top face of the conductive line 110. The first portion 118 and the second portion 128 of the magnetic structure 150 may include a magnetic material, such as a magnetic paste or ink (e.g., a resin material having magnetic particles in a polymer matrix, such as iron particles in an epoxy or other polymer matrix).

Material stubs 148 may be disposed at side faces of the magnetic structure 150. The material stubs 148 may include copper 104 and nickel 106. In some embodiments, the thickness 152 of the nickel 106 may be between 3 microns and 10 microns (e.g., between 4 microns and 6 microns), and the thickness 154 of the copper 104 may be between 3 microns and 15 microns (e.g., between 3 microns and 12 microns, or between 5 microns and 10 microns). The width 158 of the material stubs 148 may be greater than or equal to 10 microns (e.g., greater than or equal to 15 microns). Although the element 104 is referred to herein as "copper 104," copper is simply an example of a material that may serve as the element 104; in other embodiments, non-copper laser-stop materials may be used, such as other metals or metal oxide materials. Similarly, although the element 106 is referred to herein as "nickel 106," nickel is simply an example of a material that may serve as the element 106; in other embodiments, other materials having associated etch chemistries that are not damaging to the material of the magnetic structure 150 may be used (e.g., any metal or metal oxide material that can be etched away with a different chemistry than the first metal).

The material stubs 148 may be included in one dielectric layer 112, while the conductive line 110 may be included in an adjacent dielectric layer 112, as shown. In some embodiments, a surface of the conductive line 110 may be coplanar with a surface of the material stubs 148. For example, a bottom surface of the nickel 106 in the material stubs 148 may be coplanar with a top surface of the conductive line 110 (and also coplanar with an interface between the two associated dielectric layers 112). The first portion 118 and the second portion 128 of the magnetic structure 150 may each have tapered shapes, narrowing toward the conductive line 110, as shown. In some embodiments, the slope of the taper of the first portion 118 and the second portion 128 may be between 10 percent and 30 percent (e.g., between 15 percent and 25 percent). The material stubs 148 may be in contact with the second portion 128 of the magnetic structure 150, as shown. In some embodiments, a thickness 156 of the conductive line 110 may be between 5 microns and 50 microns (e.g., between 10 microns and 40 microns). In some embodiments, a height 166 of the magnetic structure 150 may be between 50 microns and 250 microns (e.g., between 100 microns and 250 microns); the heights of the first portion 118 and the second portion 128 may be the same, or they may be different. In some embodiments, the interconnect structures 108 and the conductive line 110 may include a metal, such as copper.

In some embodiments, the material stubs 148 may be artifacts of the particular manufacturing process described in FIG. 2. The manufacturing process described in FIG. 2 may also be associated with various features of the interconnect structures 108 included in the IC package support 100. For example, the interconnect structures 108 may include a via 122 that extends all the way through the associated dielectric layer 112, as shown. Such a via 122 may be tapered, with its smaller face coplanar with the bottom surface of the material stubs 148 and the top surface of the conductive line 110, as shown. In another example, the interconnect structures 108 may include a via 130 that extends all the way through an associated dielectric layer 112 and into the adjacent dielectric layer 112 such that the smaller face of the via 130 is in a different dielectric layer 112 than the larger face of the via 130. Further, such a via 130 may be at least partially coplanar with the second portion 128 of the magnetic structure 150; in particular, the second portion 128 of the magnetic structure 150 may end at an interface between two adjacent dielectric layers 112, and the via 130 may extend through the same interface. The via 120 is another example of an interconnect structure 108 that extends all the way through an associated dielectric layer 112 and into the adjacent dielectric layer 112 such that the smaller face of the via 120 is in a different dielectric layer 112 than the larger face of the via 120. Further, the via 120 may be at least partially coplanar with the first portion 118 of the magnetic structure 150; in particular, the first portion 118 of the magnetic structure 150 may end at an interface between two adjacent dielectric layers 112, and the via 120 may extend through the same interface. Like the first portion 118 and the second portion 128 of the magnetic structure 150 may taper toward each other, the vias 120 and 130 may taper toward each other.

Figure 2A:
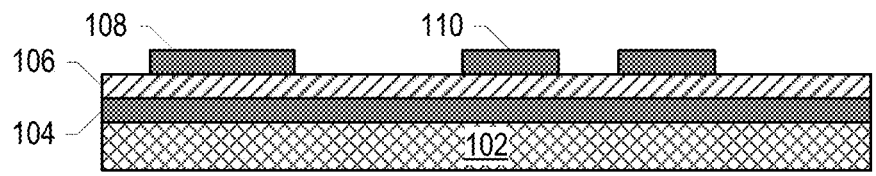
FIGS. 2A-2O illustrate stages in an example process of manufacturing the IC package support of FIG. 1, in accordance with various embodiments.
Figure 2B:
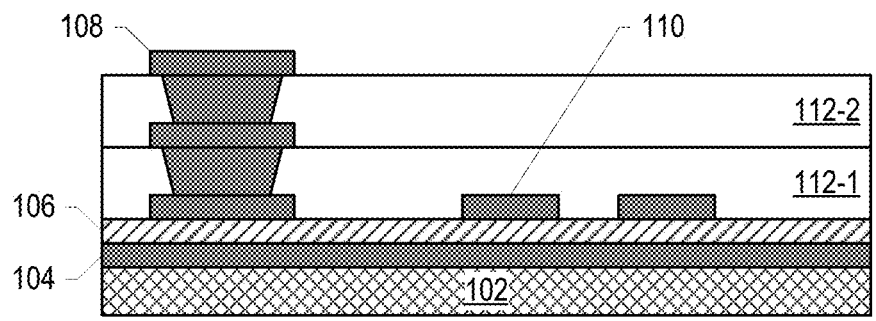
Figure 2C:
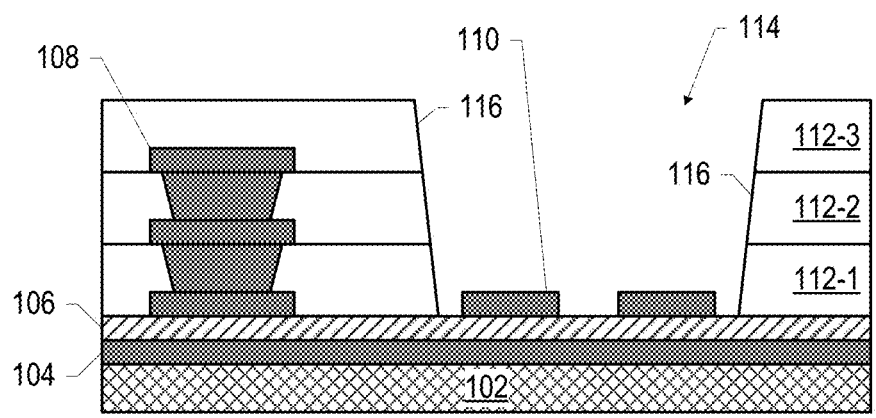
Figure 2D:
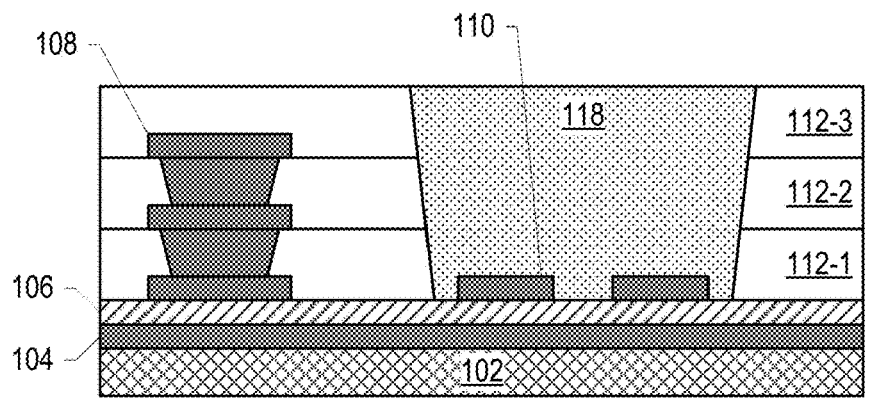
Figure 2E:
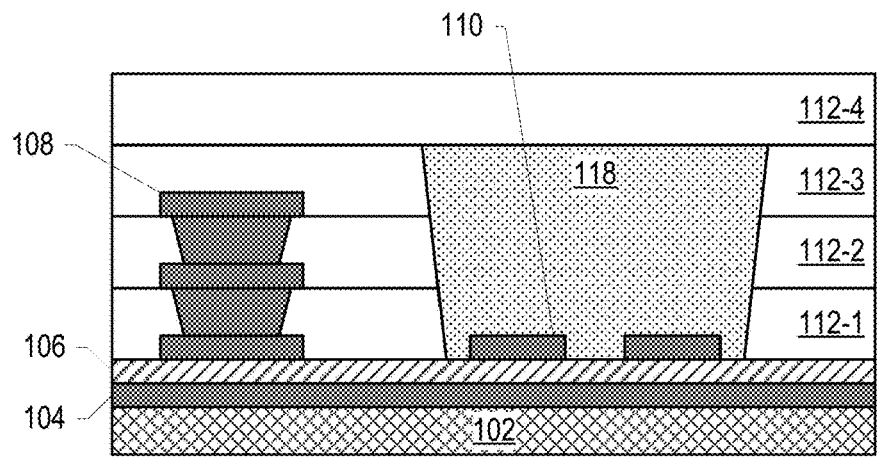
Figure 2F:
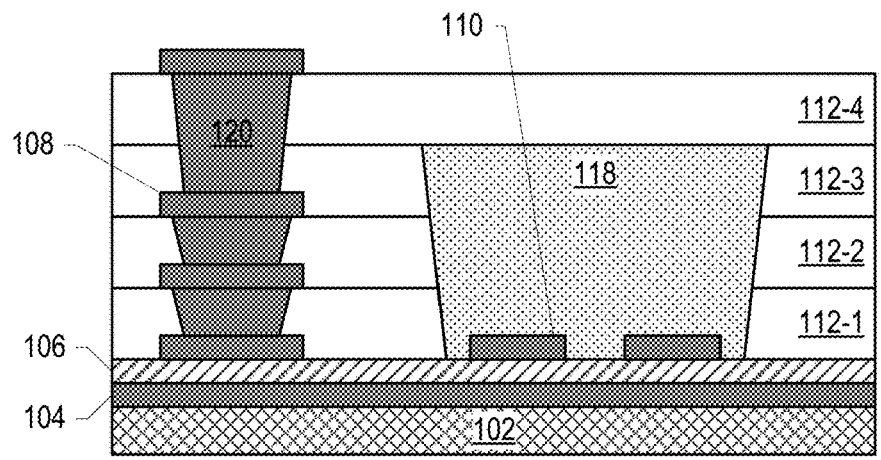
Figure 2G:
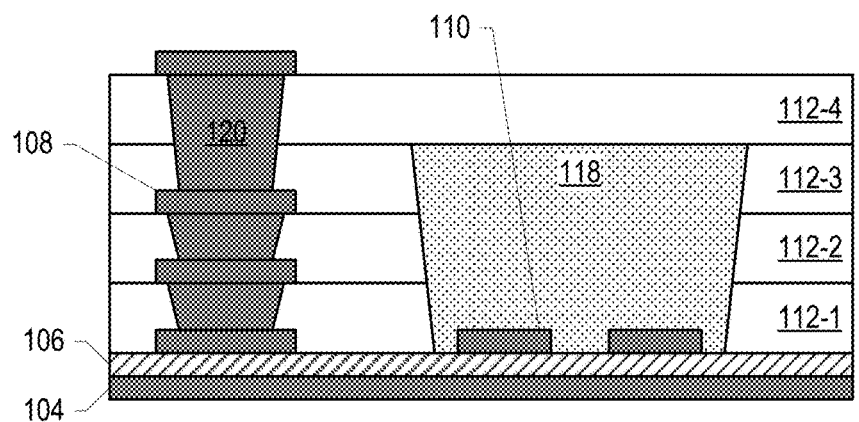
Figure 2H:
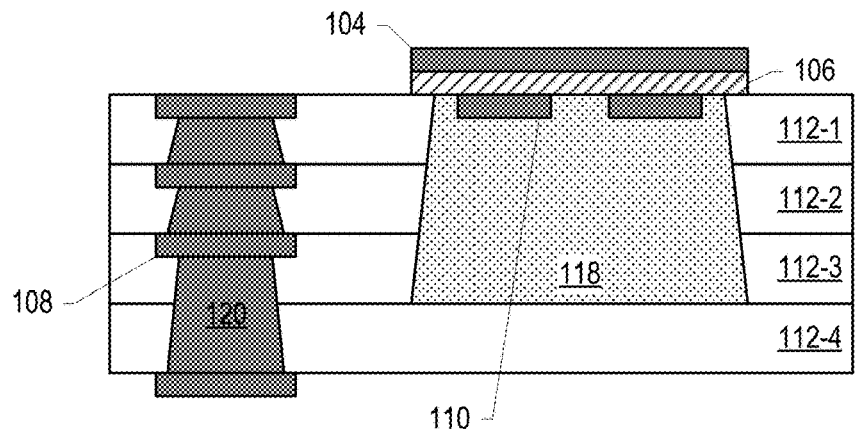
Figure 2I:
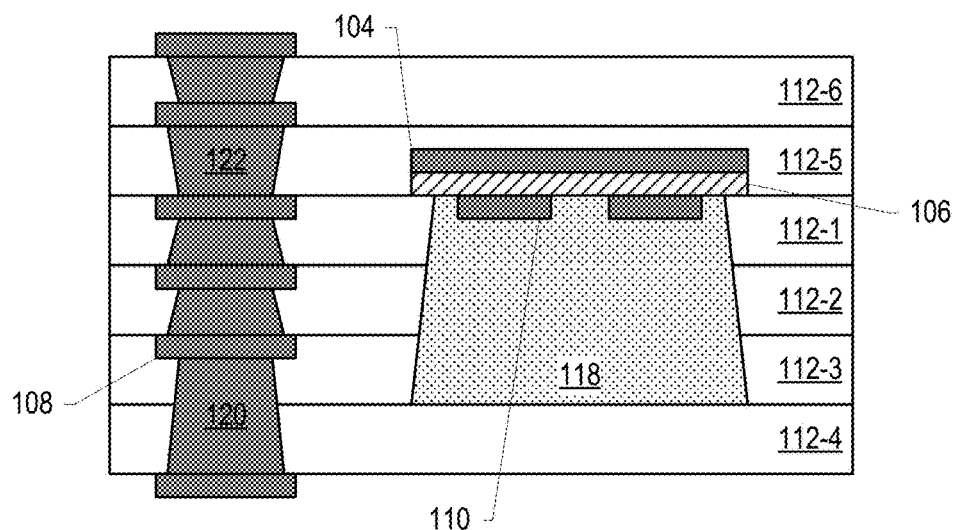
Figure 2J:
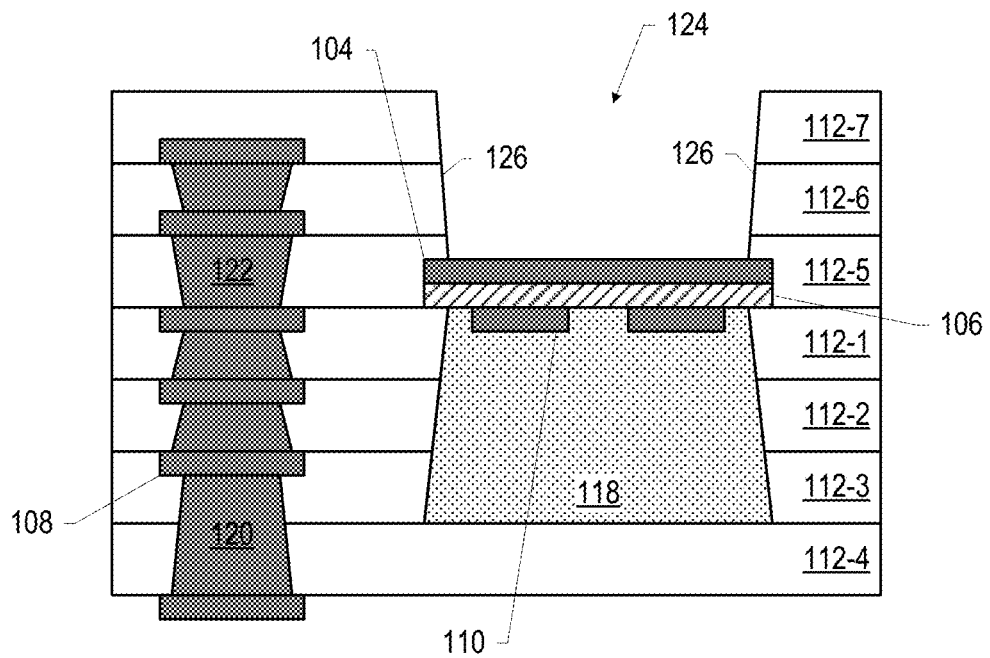
Figure 2K:
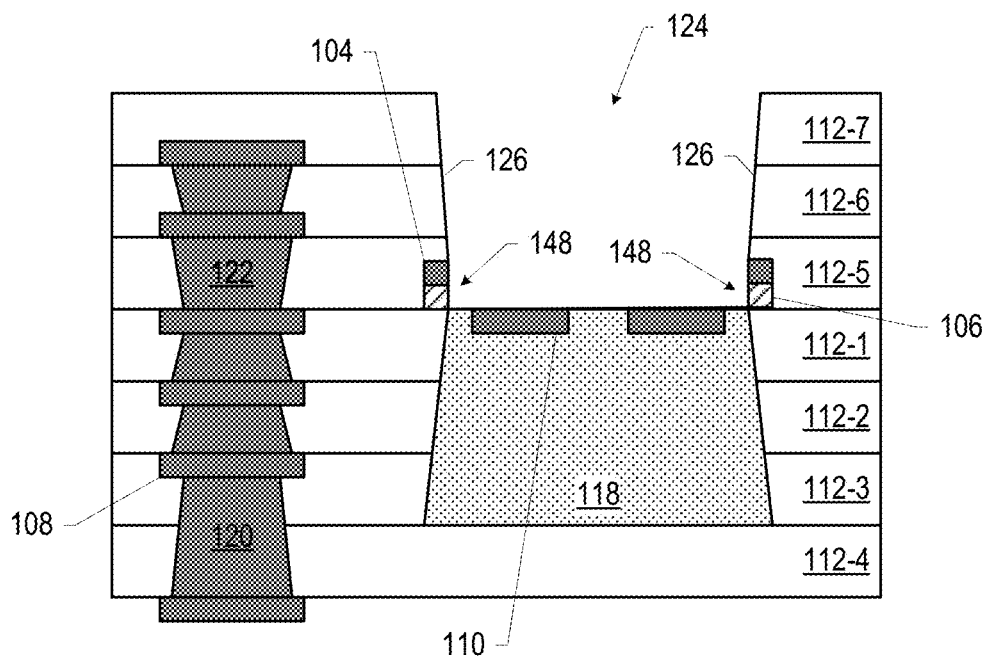
Figure 2L:
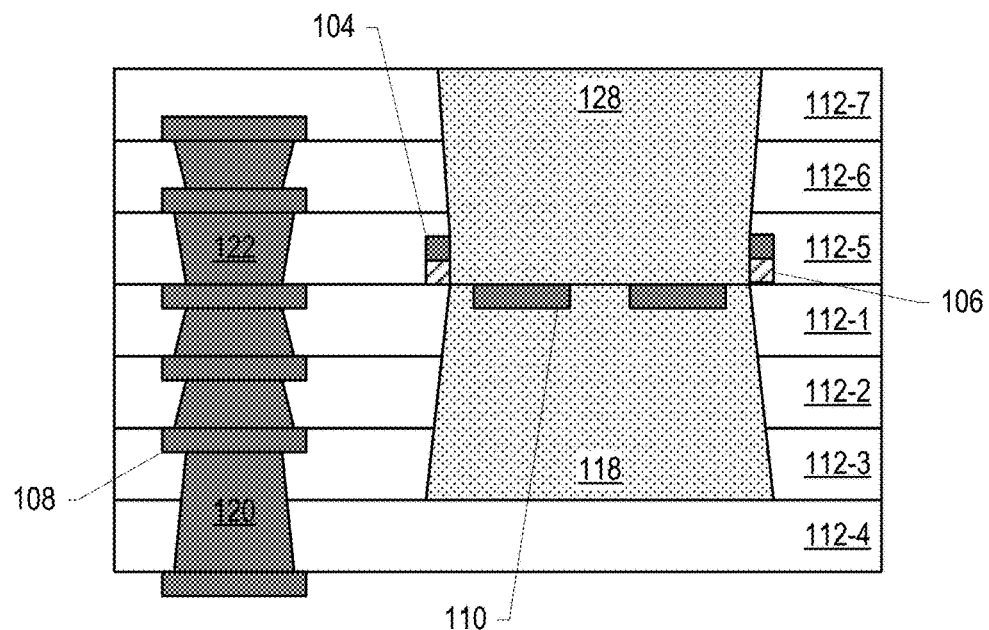
Figure 2M:
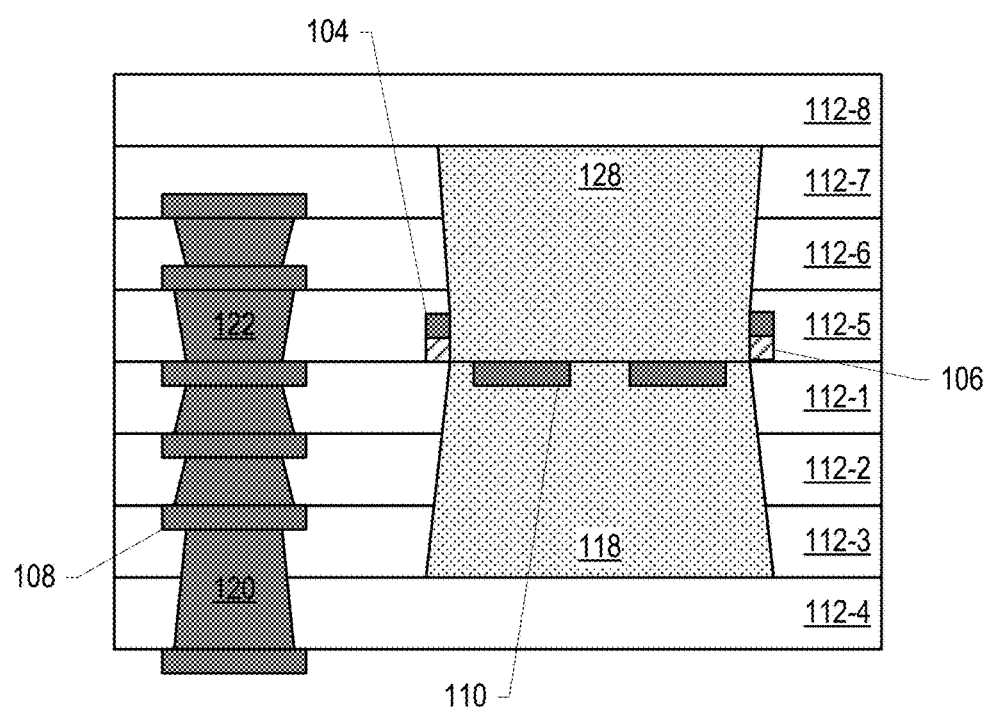
Figure 2N:
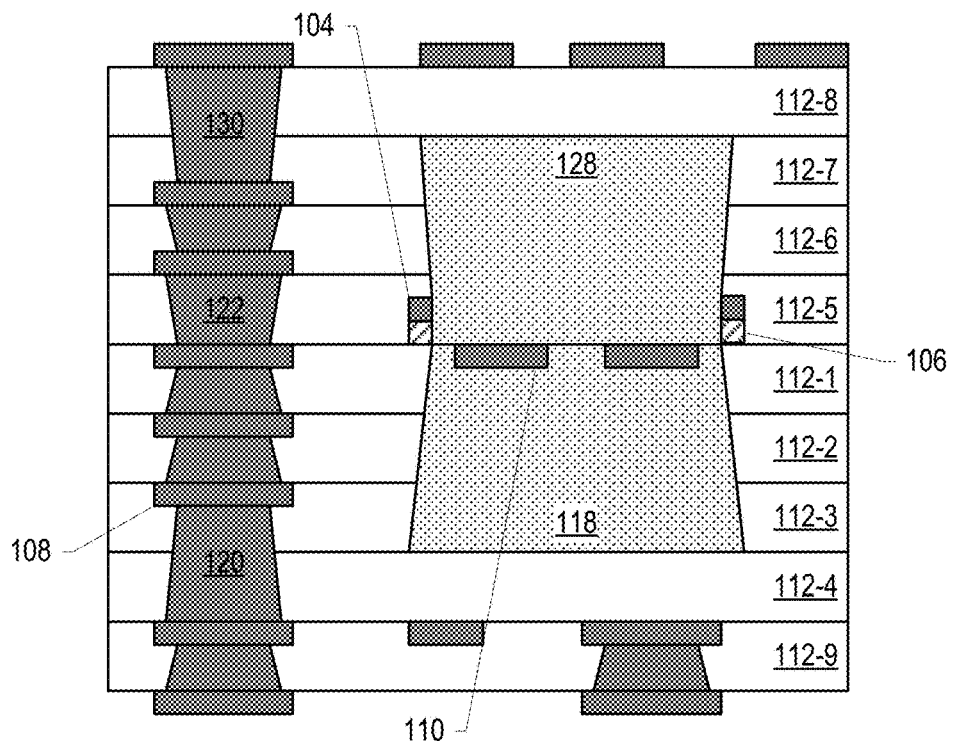
Figure 2O:
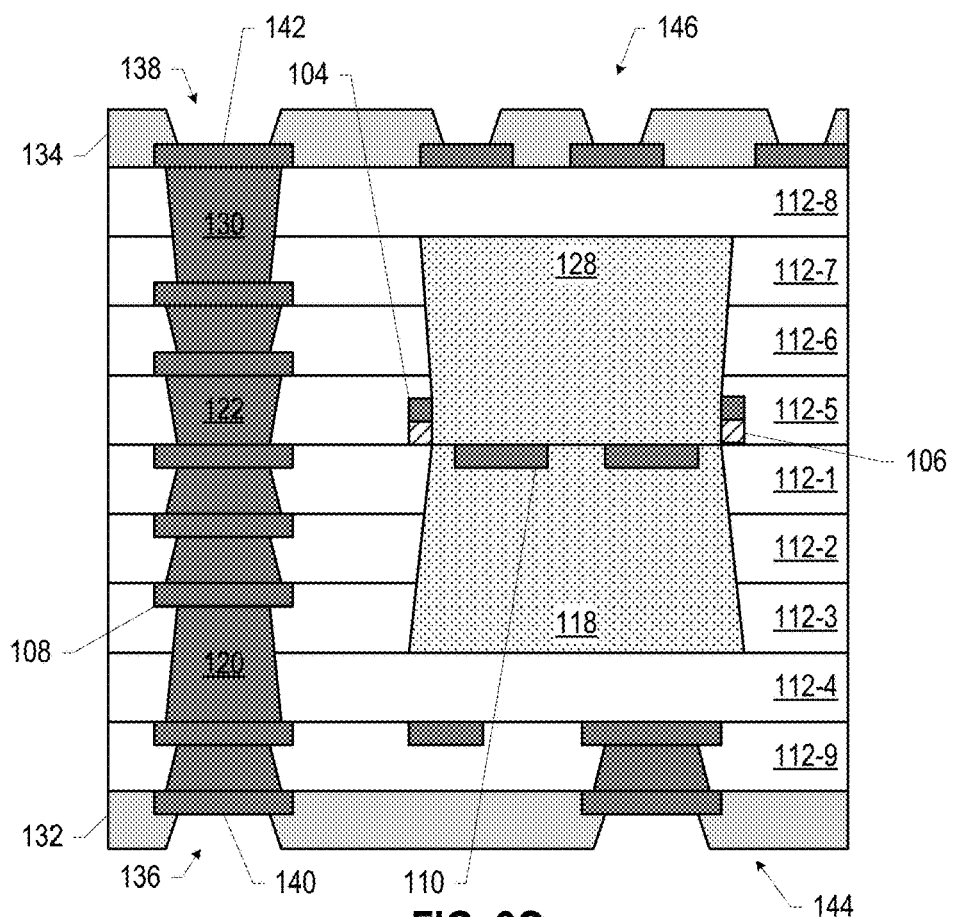

FIGS. 2A-2O illustrate stages in an example process of manufacturing the IC package support 100 (e.g., a package substrate or an interposer) of FIG. 1, in accordance with various embodiments. Although the operations of FIG. 2 may be illustrated with reference to particular embodiments of the IC package supports 100 and magnetic structures 150 disclosed herein, the method may be used to form any suitable IC package supports 100 and/or magnetic structures 150. Operations are illustrated once each and in a particular order in FIG. 2, but the operations may be reordered and/or repeated as desired (e.g., with different operations performed in parallel when manufacturing multiple IC package supports 100 and/or magnetic structures 150 simultaneously). The manufacturing process illustrated in FIG. 2 may advantageously allow the fabrication of an IC package support 100 with a completed magnetic structure 150 to which further components (e.g., dies) may be coupled. Some previous manufacturing processes required that a die be attached to an IC package support whose integrated magnetic structure required additional processing (e.g., the deposition of additional magnetic material) before the magnetic structure was complete. Such processes may suffer from low yield, as any errors in the additional processing of the IC package support might mean the loss of an (expensive) die.

FIG. 2A illustrates an assembly including a carrier 102 on which a layer of copper 104 and a layer of nickel 106 have been formed. A patterned layer of conductive material has also been formed on the nickel 106, with the patterned conductive material including an interconnect structure 108 (e.g., a pad or line, as shown) and one or more conductive lines 110 (that will be surrounded by the magnetic structure 150, as discussed further below). The carrier 102 may include any suitable material for performing subsequent manufacturing operations, and providing mechanical stability during subsequent manufacturing operations (e.g., silicon, glass, ceramic, etc.). The copper 104 may be a foil layer on the carrier 102, and may have a thickness in accordance with any of the thicknesses 154 disclosed herein. The nickel 106 may be blanket plated onto the copper 104, and may have a thickness in accordance with any of the thicknesses 156 disclosed herein. The interconnect structure 108 and conductive line 110 of the assembly of FIG. 2A may be formed using any suitable technique (e.g., a lithographic technique).

FIG. 2B illustrates an assembly subsequent to providing dielectric layers 112-1 and 112-2 on the assembly of FIG. 2A and forming further interconnect structures 108 in and on the dielectric layers 112. The dielectric layers 112 may be provided in any suitable manner (e.g., by lamination of a dielectric film) and the interconnect structures 108 of FIG. 2B may be formed using any suitable technique (e.g., a semi-additive process (SAP) in which a seed layer is formed, a photoresist is deposited and patterned to expose the seed layer, conductive material is electroplated on the seed layer, the photoresist is stripped, and a brief seed etch is performed). Although different ones of the dielectric layers 112 in FIG. 2B (and others of the accompanying drawings) are shown as having the same thickness, this is simply for ease of illustration, and different ones of the dielectric layers 112 in an IC package support 100 may have different thicknesses.

FIG. 2C illustrates an assembly subsequent to forming another dielectric layer 112-3 on the assembly of FIG. 2B, and then forming a cavity 114 through the dielectric layers 112. The cavity 114 may expose the conductive line 110 on the nickel 106, as shown. The cavity 114 may be formed using any suitable technique, such as laser drilling. In some embodiments, the sidewalls 116 of the cavity 114 may be angled, providing a taper to the cavity 114 that narrows toward the conductive line 110. In some embodiments, a desmear operation may be performed after forming the cavity 114. In some embodiments in which the dielectric layers 112-1, 112-2, and 112-3 are photoimageable dielectrics, the cavity 114 may be formed by selectively exposing and developing the dielectric layers 112, instead of laser drilling, as known in the art.

FIG. 2D illustrates an assembly subsequent to filling the cavity 114 of the assembly of FIG. 2C with a magnetic material to form the first portion 118 of the magnetic structure 150. Although FIG. 2D illustrates the first portion 118 as extending through three dielectric layers 112, this is simply illustrative, and in other embodiments, the first portion 118 may extend through any suitable number of dielectric layers 112 (e.g., two, three, four, or five dielectric layers 112). As noted above, the magnetic material may include a magnetic paste or ink. Filling the cavity 114 with the magnetic material may include dispensing the magnetic material into the cavity 114 using a tool similar to that used for some solder dispensing applications. In some embodiments, filling the cavity 114 with the magnetic material may include stencil printing the magnetic material into the cavity 114. After initial deposition, the magnetic material may be allowed to cure, and then the resulting assembly may be polished to flatten the top surface; this polishing may remove some of the dielectric layer 112-3, but may not reach the interconnect structures 108 in the dielectric layers 112-3. The first portion 118 may have a top surface that is substantially coplanar with the top surface of the dielectric layer 112-3. Using a cavity 114 to control the shape and dimensions of the first portion 118 of the magnetic structure 150 may mitigate the risks of magnetic paste bleedout and variable dimensions that are associated with conventional paste printing techniques. Further, in some embodiments, the use of a cavity 114 to form the first portion 118 may not require the use of a mask. Since conventional masks used to print magnetic paste typically leave significant paste residue on the mask after printing, avoiding the use of such masks may reduce manufacturing complexity and improve reliability.

FIG. 2E illustrates an assembly subsequent to forming a dielectric layer 112-4 on the top surface of the assembly of FIG. 2D. The dielectric layer 112-4 may extend over the dielectric layer 112-3 and the first portion 118, as shown. The dielectric layer 112-4 may "seal off" the first portion 118, and protect it from subsequent wet chemistry.

FIG. 2F illustrates an assembly subsequent to forming additional interconnect structures 108 in the assembly of FIG. 2E. These additional interconnect structures 108 may include a via 120, as described above; the via 120 may extend through the dielectric layer 112-4 and into the dielectric layer 112-3 to make contact with a conductive pad/line in the dielectric layer 112-3.

FIG. 2G illustrates an assembly subsequent to detaching the carrier 102 from the assembly of FIG. 2F. In some embodiments, mechanical and/or chemical techniques may be used to detach the carrier 102, as known in the art. In some embodiments, when the assembly of FIG. 2G is stiff enough (e.g., when the dielectric layers 112 through which the cavity 114 is formed are glass cloth-based), further processing can continue without attaching the assembly to another carrier to avoid handling or warpage issues. In other embodiments in which the assembly of FIG. 2G is less stiff (e.g., when all of the dielectric layers 112 through which the cavity 114 is formed include a buildup film), the assembly of FIG. 2G may be attached to another carrier or another half-finished IC package support 100 (not shown) for further processing.

FIG. 2H illustrates an assembly subsequent to inverting the assembly of FIG. 2G and patterning the nickel 106 and copper 104 so that the nickel 106 and copper 104 are present only proximate to the conductive lines 110, extending for a distance beyond the lateral extent of the first portion 118, as shown. In some embodiments, the distance by which the patterned copper 104/nickel 106 extend beyond the lateral extent of the first portion 118 may take the form of any of the embodiments of the width 158 disclosed herein.

FIG. 2I illustrates an assembly subsequent to providing dielectric layers 112-5 and 112-6 on the assembly of FIG. 2H and forming further interconnect structures 108 in and on the dielectric layers 112-5 and 112-6. The dielectric layers 112 may be provided in any suitable manner (e.g., by lamination of a dielectric film) and the interconnect structures 108 of FIG. 2I may be formed using any suitable technique (e.g., an SAP technique). In some embodiments, the additional interconnect structures 108 of the assembly of FIG. 2I may include a via 122, which may be included in the same dielectric layer 112-5 as the patterned copper 104/nickel 106 (and thus will be in the same dielectric layer 112 as the material stubs 148 in the IC package support 100, as discussed further below).

FIG. 2J illustrates an assembly subsequent to forming another dielectric layer 112-7 on the assembly of FIG. 2I, and then forming a cavity 124 through the dielectric layers 112-6 and 112-7 and into the dielectric layer 112-5. The cavity 124 may expose the copper 104, as shown. The cavity 124 may be formed using any suitable technique, such as laser drilling (for which the copper 104 may serve as a laser stop). In some embodiments, the sidewalls 126 of the cavity 124 may be angled, providing a taper to the cavity 124 that narrows toward the conductive line 110. In some embodiments, a desmear operation may be performed after forming the cavity 124. In some embodiments in which the dielectric layers 112-5, 112-6, and 112-7 are photoimageable dielectrics, the cavity 124 may be formed by selectively exposing and developing the dielectric layers 112, instead of laser drilling, as known in the art.

FIG. 2K illustrates an assembly subsequent to removing the exposed copper 104 in the cavity 124 of the assembly of FIG. 2J, and then removing the exposed nickel 106, leaving the material stubs 148, as shown. Any suitable etch techniques may be used to remove the copper 104/nickel 106. In some embodiments, the etch chemistry used to remove the nickel 106 may not damage the magnetic material of the underlying first portion 118, while the etch chemistry used to remove the copper 104 would be damaging to the magnetic material; the nickel 106 or other material may thus serve to protect the underlying first portion 118 during these operations.

FIG. 2L illustrates an assembly subsequent to filling the cavity 124 of the assembly of FIG. 2K with a magnetic material to form the second portion 128 of the magnetic structure 150. Although FIG. 2L illustrates the second portion 128 as extending through three dielectric layers 112 (the dielectric layers 112-5, 112-6, and 112-7), this is simply illustrative, and in other embodiments, the second portion 128 may extend through any suitable number of dielectric layers 112 (e.g., two, three, four, or five dielectric layers 112). The magnetic material may be provided to the cavity 124 in accordance with any suitable technique, such as any of the techniques discussed above with reference to FIG. 2D.

FIG. 2M illustrates an assembly subsequent to forming a dielectric layer 112-8 on the top surface of the assembly of FIG. 2L. The dielectric layer 112-8 may extend over the dielectric layer 112-7 and the second portion 128, as shown. The dielectric layer 112-8 may "seal off" the second portion 128, and protect it from subsequent wet chemistry.

FIG. 2N illustrates an assembly subsequent to forming additional dielectric layers 112 (e.g., an additional dielectric layer 112-9) and additional interconnect structures 108 in the assembly of FIG. 2M. These additional interconnect structures 108 may include a via 130, as described above; the via 130 may extend through the dielectric layer 112-8 and into the dielectric layer 112-7 to make contact with a conductive pad/line in the dielectric layer 112-7. Although a particular arrangement of dielectric layers 112 and interconnect structures 108 is depicted in FIG. 2N, this is simply illustrative, and any desired number and arrangement of dielectric layers 112 and interconnect structures 108 may be used.

FIG. 2O illustrates an assembly subsequent to providing a solder resist 132 and openings 136 therein to expose the conductive contacts at the second face 144 of the assembly of FIG. 2N, and providing a solder resist 134 and openings 138 therein to expose the conductive contacts at the first face 146. The resulting assembly may take the form of the IC package support 100 of FIG. 1.

The IC package supports 100 disclosed herein may be included in any suitable electronic component. FIGS. 3-7 illustrate various examples of apparatuses that may include any of the IC package supports 100 disclosed herein, or may be included in an IC package that also includes any of the IC package supports 100 disclosed herein.

Figure 3:
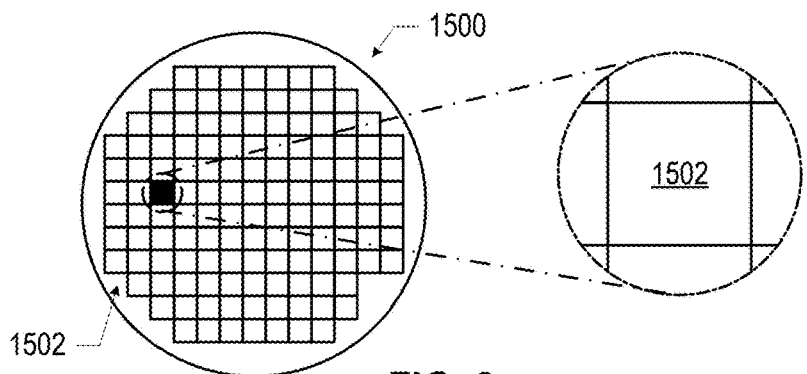
FIG. 3 is a top view of a wafer and dies that may be included in an IC package having an IC package support in accordance with any of the embodiments disclosed herein.

FIG. 3 is a top view of a wafer 1500 and dies 1502 that may be included in an IC package including one or more IC package supports 100 (e.g., as discussed below with reference to FIG. 5) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 4, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 4:
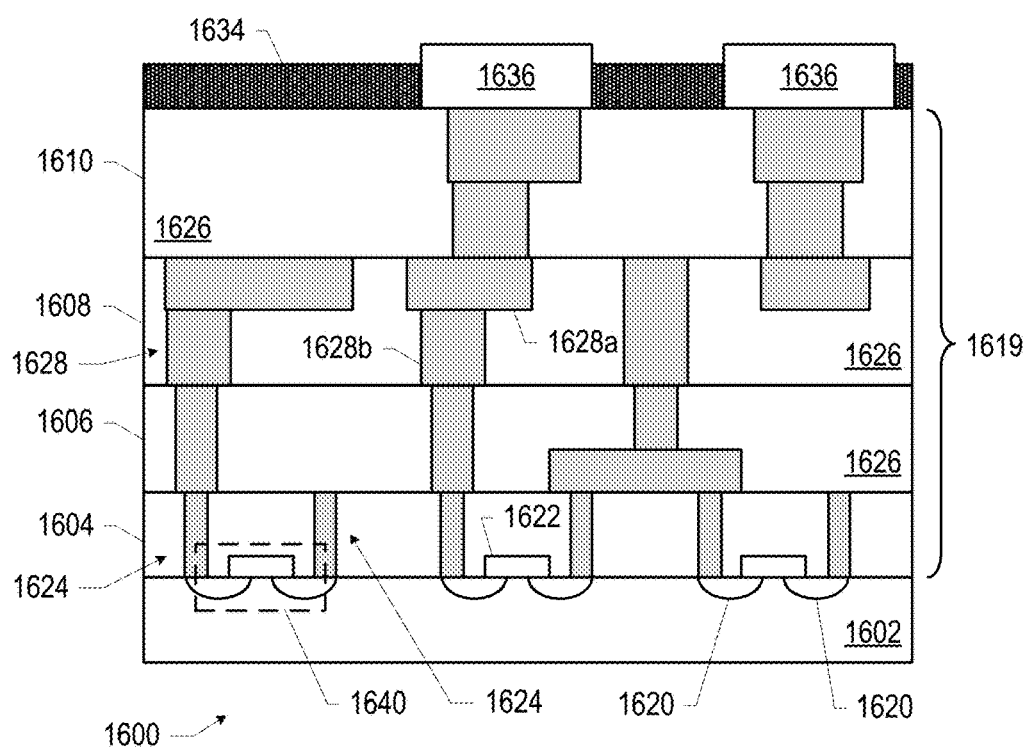
FIG. 4 is a side, cross-sectional view of an IC device that may be included in an IC package having an IC package support in accordance with any of the embodiments disclosed herein.

FIG. 4 is a side, cross-sectional view of an IC device 1600 that may be included in an IC package including one or more IC package supports 100 (e.g., as discussed below with reference to FIG. 5), in accordance with any of the embodiments disclosed herein. One or more of the IC devices 1600 may be included in one or more dies 1502 (FIG. 3). The IC device 1600 may be formed on a substrate 1602 (e.g., the wafer 1500 of FIG. 3) and may be included in a die (e.g., the die 1502 of FIG. 3). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 3) or a wafer (e.g., the wafer 1500 of FIG. 3).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 4 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etch/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form cavities at the locations of the S/D regions 1620. An epitaxial deposition process may then be carried out to fill the cavities with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 4 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 4). Although a particular number of interconnect layers 1606-1610 is depicted in FIG. 4, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 4. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 4. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 4, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 5:
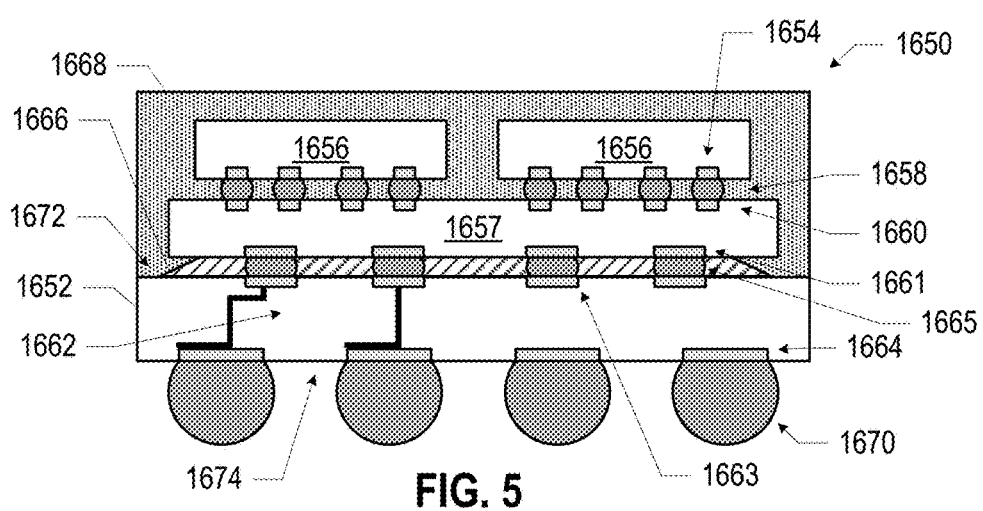
FIG. 5 is a side, cross-sectional view of an IC package that may include any of the IC package supports disclosed herein.

FIG. 5 is a side, cross-sectional view of an example IC package 1650 that may include one or more IC package supports 100, in accordance with any of the embodiments disclosed herein. For example, the package substrate 1652 and/or the interposer 1657 may be an IC package support 100, in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, etc.), and may have conductive pathways extending through the dielectric material between the surface 1672 and the surface 1674, or between different locations on the surface 1672, and/or between different locations on the surface 1674. These conductive pathways may take the form of any of the interconnects 1628 discussed above with reference to FIG. 4.

The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, FLI 1665, and the conductive contacts 1663 of the package substrate 1652. The FLI 1665 illustrated in FIG. 5 are solder bumps, but any suitable FLI 1665 may be used. In some embodiments, no interposer 1657 may be included in the IC package 1650; instead, the dies 1656 may be coupled directly to the conductive contacts 1663 at the surface 1672 by FLI 1665.

The IC package 1650 may include one or more dies 1656 coupled to the interposer 1657 via conductive contacts 1654 of the dies 1656, FLI 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The FLI 1658 illustrated in FIG. 5 are solder bumps, but any suitable FLI 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the FLI 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. SLI 1670 may be coupled to the conductive contacts 1664. The SLI 1670 illustrated in FIG. 5 are solder balls (e.g., for a ball grid array (BGA) arrangement), but any suitable SLI 16770 may be used (e.g., pins in a pin grid array arrangement or lands in a land grid array arrangement). The SLI 1670 may be used to couple the IC package 1650 to another component, such as a circuit board (e.g., a motherboard), an interposer, or another IC package, as known in the art and as discussed below with reference to FIG. 6.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 5 is a flip chip package, other package architectures may be used. For example, the IC package 1650 may be a BGA package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 5, an IC package 1650 may include any desired number of dies 1656. An IC package 1650 may include additional passive components, such as surface-mount resistors, capacitors, and inductors disposed on the first surface 1672 or the second surface 1674 of the package substrate 1652, or on either surface of the interposer 1657. More generally, an IC package 1650 may include any other active or passive components known in the art.

Figure 6:
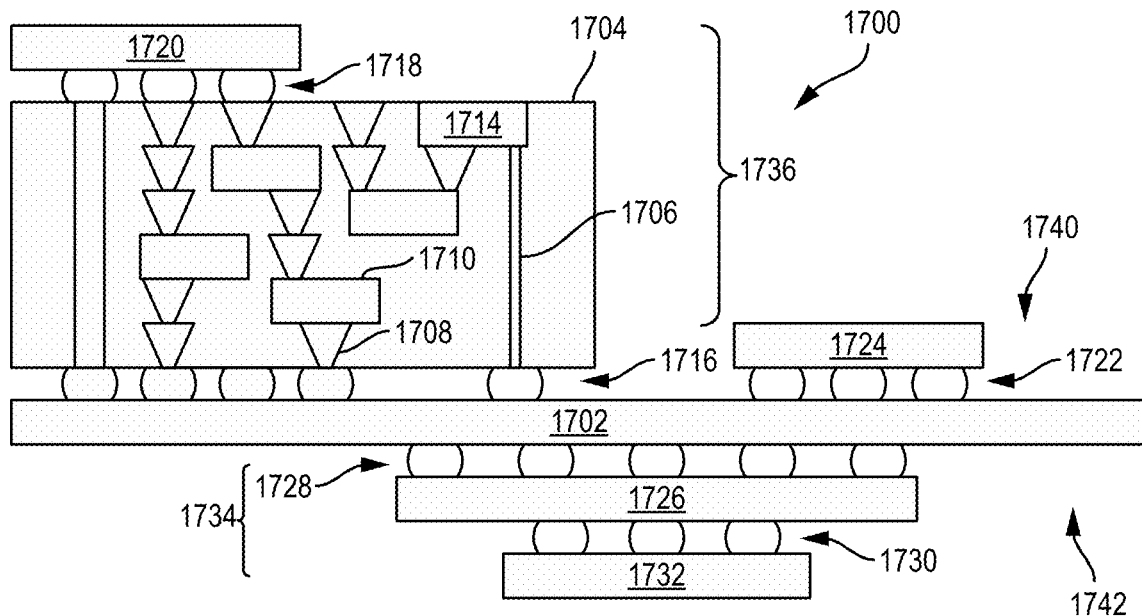
FIG. 6 is a side, cross-sectional view of an IC device assembly that may include an IC package support in accordance with any of the embodiments disclosed herein.

FIG. 6 is a side, cross-sectional view of an IC device assembly 1700 that may include one or more IC package supports 100, in accordance with any of the embodiments disclosed herein. The IC device assembly 1700 includes a number of components disposed on a circuit board 1702 (which may be, e.g., a motherboard). The IC device assembly 1700 includes components disposed on a first surface 1740 of the circuit board 1702 and an opposing second surface 1742 of the circuit board 1702; generally, components may be disposed on one or both surfaces 1740 and 1742. Any of the IC packages discussed below with reference to the IC device assembly 1700 may take the form of any of the embodiments of the IC package 1650 discussed above with reference to FIG. 5 (e.g., may include one or more IC package supports 100 as a package substrate 1652 or an interposer 1657).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 includes a package-on-interposer structure 1736 coupled to the first surface 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 3), an IC device (e.g., the IC device 1600 of FIG. 4), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first surface 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second surface 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
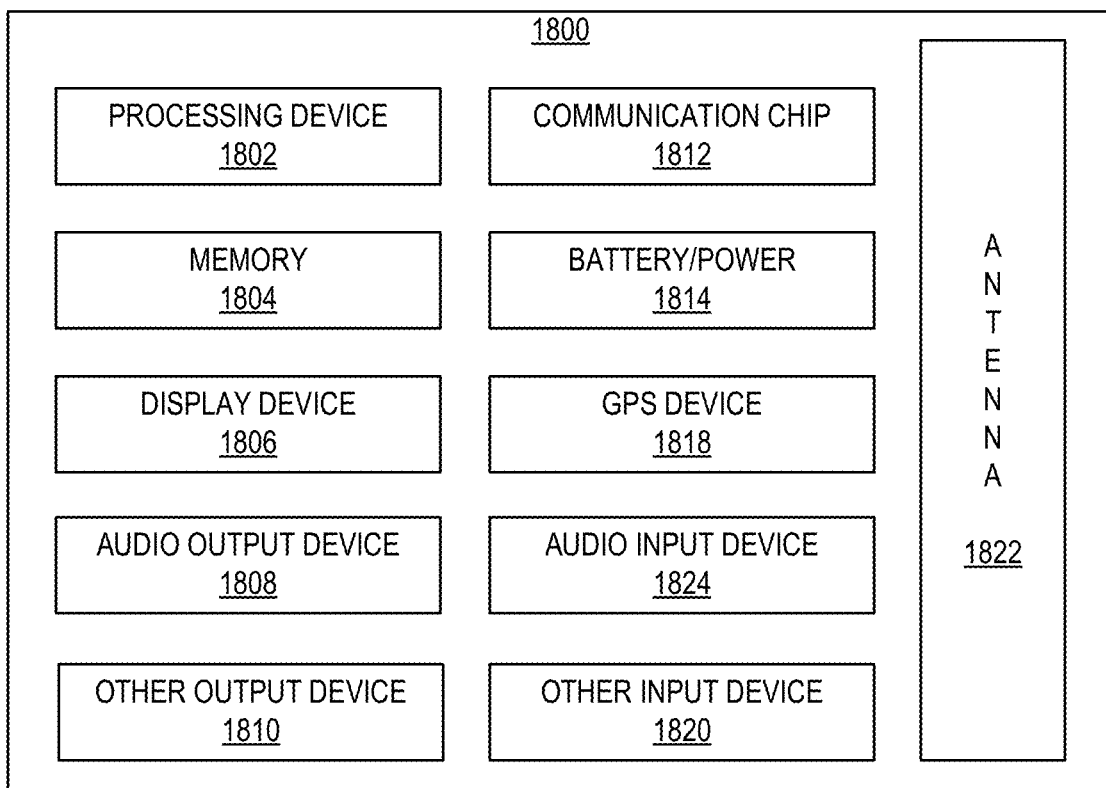
FIG. 7 is a block diagram of an example electrical device that may include an IC package support in accordance with any of the embodiments disclosed herein.

FIG. 7 is a block diagram of an example electrical device 1800 that may include one or more IC package supports 100, in accordance with any of the embodiments disclosed herein. Any suitable ones of the components of the electrical device 1800 may include one or more of the IC device assemblies 1700, IC packages 1650, IC devices 1600, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a conductive line; a magnetic structure around the conductive line; and material stubs at side faces of the magnetic structure.

Example 2 includes the subject matter of Example 1, and further specifies that the material stubs include a laser-stop material.

Example 3 includes the subject matter of any of Examples 1-2, and further specifies that the material stubs include copper.

Example 4 includes the subject matter of Example 3, and further specifies that the copper of the material stubs has a thickness between 3 microns and 12 microns.

Example 5 includes the subject matter of any of Examples 3-4, and further specifies that the material stubs include nickel.

Example 6 includes the subject matter of Example 5, and further specifies that the nickel of the material stubs has a thickness between 3 microns and 10 microns.

Example 7 includes the subject matter of any of Examples 5-6, and further specifies that a surface of the conductive line is coplanar with a surface of the nickel of the material stubs.

Example 8 includes the subject matter of any of Examples 5-7, and further specifies that a plane of the nickel of the material stubs is between a plane of the copper of the material stubs and a plane of the conductive line.

Example 9 includes the subject matter of any of Examples 1-2, and further specifies that the material stubs include nickel.

Example 10 includes the subject matter of Example 9, and further specifies that the nickel of the material stubs has a thickness between 3 microns and 10 microns.

Example 11 includes the subject matter of any of Examples 9-10, and further specifies that a surface of the conductive line is coplanar with a surface of the nickel of the material stubs.

Example 12 includes the subject matter of any of Examples 1-11, and further specifies that a surface of the conductive line is coplanar with a surface of the material stubs.

Example 13 includes the subject matter of any of Examples 1-12, and further specifies that the magnetic structure includes a first portion and a second portion, the first portion of the magnetic structure is at top and side faces of the conductive line, the second portion of the magnetic structure is at a bottom face of the conductive line, and the first portion has a tapered shape that narrows toward the conductive line.

Example 14 includes the subject matter of Example 13, and further specifies that the second portion has a tapered shape that narrows toward the conductive line.

Example 15 includes the subject matter of any of Examples 1-14, and further specifies that the magnetic structure has a height between 100 microns and 200 microns.

Example 16 includes the subject matter of any of Examples 1-15, and further specifies that the conductive line has a thickness between 10 microns and 40 microns.

Example 17 includes the subject matter of any of Examples 1-16, and further includes: a first layer of dielectric material at a first surface of the magnetic structure; and a second layer of dielectric material at a second surface of the magnetic structure, wherein the second surface is opposite to the first surface.

Example 18 includes the subject matter of any of Examples 1-17, and further specifies that the magnetic structure includes magnetic particles embedded in a polymer matrix.

Example 19 includes the subject matter of any of Examples 1-18, and further includes: a conductive via at least partially coplanar with the material stubs, wherein the conductive via is embedded in a layer of dielectric material, and extends between the top of the layer of dielectric material to the bottom of the layer of dielectric material.

Example 20 includes the subject matter of any of Examples 1-19, and further includes: a conductive via at least partially coplanar with the magnetic structure, wherein the conductive via extends from a top of a layer of dielectric material beyond a bottom of the layer of dielectric material, and the layer of dielectric material is at a surface of the magnetic structure.

Example 21 includes the subject matter of any of Examples 1-20, and further specifies that the IC package support is a package substrate.

Example 22 includes the subject matter of any of Examples 1-20, and further specifies that the IC package support is an interposer.

Example 23 includes the subject matter of any of Examples 1-22, and further specifies that the conductive line and magnetic structure are part of an inductor.

Example 24 includes the subject matter of Example 23, and further specifies that the IC package support includes a plurality of inductors.

Example 25 is an integrated circuit (IC) package support, including: a conductive line; and a magnetic structure around the conductive line, wherein the magnetic structure includes a first portion and a second portion, the first portion of the magnetic structure is at top and side faces of the conductive line, the second portion of the magnetic structure is at a bottom face of the conductive line, the first portion has a tapered shape that narrows toward the conductive line, and the second portion has a tapered shape that narrows toward the conductive line.

Example 26 includes the subject matter of Example 25, and further specifies that the magnetic structure has a height between 100 microns and 200 microns.

Example 27 includes the subject matter of any of Examples 25-26, and further specifies that the conductive line has a thickness between 10 microns and 40 microns.

Example 28 includes the subject matter of any of Examples 25-27, and further includes: a first layer of dielectric material at a first surface of the magnetic structure; and a second layer of dielectric material at a second surface of the magnetic structure, wherein the second surface is opposite to the first surface.

Example 29 includes the subject matter of any of Examples 25-28, and further specifies that the magnetic structure includes magnetic particles embedded in a polymer matrix.

Example 30 includes the subject matter of any of Examples 25-29, and further includes: a conductive via at least partially coplanar with the magnetic structure, wherein the conductive via is embedded in a layer of dielectric material, and extends between the top of the layer of dielectric material to the bottom of the layer of dielectric material.

Example 31 includes the subject matter of any of Examples 25-30, and further includes: a conductive via at least partially coplanar with the magnetic structure, wherein the conductive via extends from a top of a layer of dielectric material beyond a bottom of the layer of dielectric material, and the layer of dielectric material is at a surface of the magnetic structure.

Example 32 includes the subject matter of any of Examples 25-31, and further specifies that the IC package support is a package substrate.

Example 33 includes the subject matter of any of Examples 25-31, and further specifies that the IC package support is an interposer.

Example 34 includes the subject matter of any of Examples 25-33, and further specifies that the conductive line and magnetic structure are part of an inductor.

Example 35 includes the subject matter of Example 34, and further specifies that the IC package support includes a plurality of inductors.

Example 36 is an integrated circuit (IC) package support, including: a conductive line; a magnetic structure around the conductive line; and copper portions at side faces of the magnetic structure.

Example 37 includes the subject matter of Example 36, and further specifies that the copper portions have a thickness between 3 microns and 12 microns.

Example 38 includes the subject matter of any of Examples 36-37, and further specifies that the copper portions contact the magnetic structure and a dielectric material proximate to the magnetic structure.

Example 39 includes the subject matter of any of Examples 36-38, and further specifies that the magnetic structure includes a first portion and a second portion, the first portion of the magnetic structure is at top and side faces of the conductive line, the second portion of the magnetic structure is at a bottom face of the conductive line, and the first portion has a tapered shape that narrows toward the conductive line.

Example 40 includes the subject matter of Example 39, and further specifies that the second portion has a tapered shape that narrows toward the conductive line.

Example 41 includes the subject matter of any of Examples 39-40, and further specifies that the copper portions are proximate to an interface between the first portion and the second portion.

Example 42 includes the subject matter of any of Examples 36-41, and further specifies that the magnetic structure has a height between 100 microns and 200 microns.

Example 43 includes the subject matter of any of Examples 36-42, and further specifies that the conductive line has a thickness between 10 microns and 40 microns.

Example 44 includes the subject matter of any of Examples 36-43, and further includes: a first layer of dielectric material at a first surface of the magnetic structure; and a second layer of dielectric material at a second surface of the magnetic structure, wherein the second surface is opposite to the first surface.

Example 45 includes the subject matter of any of Examples 36-44, and further specifies that the magnetic structure includes magnetic particles embedded in a polymer matrix.

Example 46 includes the subject matter of any of Examples 36-45, and further includes: a conductive via at least partially coplanar with the copper portions, wherein the conductive via is embedded in a layer of dielectric material, and extends between the top of the layer of dielectric material to the bottom of the layer of dielectric material.

Example 47 includes the subject matter of any of Examples 36-46, and further includes: a conductive via at least partially coplanar with the magnetic structure, wherein the conductive via extends from a top of a layer of dielectric material beyond a bottom of the layer of dielectric material, and the layer of dielectric material is at a surface of the magnetic structure.

Example 48 includes the subject matter of any of Examples 36-47, and further specifies that the IC package support is a package substrate.

Example 49 includes the subject matter of any of Examples 36-47, and further specifies that the IC package support is an interposer.

Example 50 includes the subject matter of any of Examples 36-49, and further specifies that the conductive line and magnetic structure are part of an inductor.

Example 51 includes the subject matter of Example 50, and further specifies that the IC package support includes a plurality of inductors.

Example 52 is an integrated circuit (IC) package, including: a package support in accordance with any of Examples 1-51; and one or more dies coupled to the package support.

Example 53 is a computing device, including: the IC package of Example 52; and a circuit board coupled to the IC package.

Example 54 includes the subject matter of Example 53, and further includes: an antenna coupled to the circuit board.

Example 55 includes the subject matter of any of Examples 53-54, and further includes: a touchscreen display coupled to the circuit board.

Example 56 is a method including any of the manufacturing methods disclosed herein.

The invention claimed is:

1. An integrated circuit (IC) package support, comprising:
a conductive line;
a magnetic structure around the conductive line, wherein the magnetic structure includes a first portion and a second portion, the first portion of the magnetic structure is at top and side faces of the conductive line, the second portion of the magnetic structure is at a bottom face of the conductive line, and the first portion has a tapered shape that narrows toward the conductive line; and
material stubs at side faces of the magnetic structure.

2. The IC package support of claim 1, wherein the material stubs include a laser-stop material.

3. The IC package support of claim 1, wherein the material stubs include copper.

4. The IC package support of claim 3, wherein the material stubs include nickel.

5. The IC package support of claim 4, wherein a surface of the conductive line is coplanar with a surface of the nickel of the material stubs.

6. The IC package support of claim 4, wherein a plane of the nickel of the material stubs is between a plane of the copper of the material stubs and a plane of the conductive line.

7. The IC package support of claim 1, wherein the material stubs include nickel.

8. The IC package support of claim 7, wherein a surface of the conductive line is coplanar with a surface of the nickel of the material stubs.

9. The IC package support of claim 1, wherein a surface of the conductive line is coplanar with a surface of the material stubs.

10. The IC package support of claim 1, wherein the magnetic structure includes a first portion and a second portion, the first portion of the magnetic structure is at top and side faces of the conductive line, the second portion of the magnetic structure is at a bottom face of the conductive line, and the first portion has a tapered shape that narrows toward the conductive line.

11. An integrated circuit (IC) package support, comprising:
a conductive line; and
a magnetic structure around the conductive line, wherein the magnetic structure includes a first portion and a second portion, the first portion of the magnetic structure is at top and side faces of the conductive line, the second portion of the magnetic structure is at a bottom face of the conductive line, the first portion has a tapered shape that narrows toward the conductive line, and the second portion has a tapered shape that narrows toward the conductive line.

12. The IC package support of claim 11, further comprising:
a first layer of dielectric material at a first surface of the magnetic structure; and
a second layer of dielectric material at a second surface of the magnetic structure, wherein the second surface is opposite to the first surface.

13. The IC package support of claim 11, wherein the magnetic structure includes magnetic particles embedded in a polymer matrix.

14. The IC package support of claim 11, further comprising:
a conductive via at least partially coplanar with the magnetic structure, wherein the conductive via is embedded in a layer of dielectric material, and extends between a top of the layer of dielectric material to a bottom of the layer of dielectric material.

15. The IC package support of claim 11, further comprising:
a conductive via at least partially coplanar with the magnetic structure, wherein the conductive via extends from a top of a layer of dielectric material beyond a bottom of the layer of dielectric material, and the layer of dielectric material is at a surface of the magnetic structure.

16. An integrated circuit (IC) package support, comprising:
a conductive line;
a magnetic structure around the conductive line, wherein the magnetic structure includes a first portion and a second portion, the first portion of the magnetic structure is at top and side faces of the conductive line, the second portion of the magnetic structure is at a bottom face of the conductive line, and the first portion has a tapered shape that narrows toward the conductive line; and
copper portions at side faces of the magnetic structure.

17. The IC package support of claim 16, wherein the copper portions contact the magnetic structure and a dielectric material proximate to the magnetic structure.

18. The IC package support of claim 16, wherein the second portion has a tapered shape that narrows toward the conductive line.

19. The IC package support of claim 16, wherein the copper portions are proximate to an interface between the first portion and the second portion.

* * * * *